(12) United States Patent
Gross et al.

(10) Patent No.: US 9,539,750 B2
(45) Date of Patent: Jan. 10, 2017

(54) TOOTHBRUSH WITH PARTIALLY COATED SURFACE

(75) Inventors: Peter Gross, Sempach-Stadt (CH); Christian Hilfiker, Triengen (CH)

(73) Assignee: TRISA HOLDING AG, Triengen (CH)

( * ) Notice: Subject to any disclaimer, the term of this patent is extended or adjusted under 35 U.S.C. 154(b) by 1799 days.

(21) Appl. No.: 12/311,975

(22) PCT Filed: Nov. 28, 2007

(86) PCT No.: PCT/EP2007/010312
§ 371 (c)(1),
(2), (4) Date: Dec. 2, 2009

(87) PCT Pub. No.: WO2008/064873
PCT Pub. Date: Jun. 5, 2008

(65) Prior Publication Data
US 2010/0101037 A1   Apr. 29, 2010

(30) Foreign Application Priority Data
Nov. 29, 2006   (EP) .................................... 06024727

(51) Int. Cl.
| A46B 5/02 | (2006.01) |
| B29C 45/16 | (2006.01) |
| A46B 15/00 | (2006.01) |
| A46D 3/00 | (2006.01) |
| A46B 5/00 | (2006.01) |
| B29C 45/14 | (2006.01) |
| B29L 9/00 | (2006.01) |
| B29L 31/42 | (2006.01) |

(52) U.S. Cl.
CPC ............. *B29C 45/1671* (2013.01); *A46B 5/02* (2013.01); *A46B 5/026* (2013.01); *A46B 15/0087* (2013.01); *A46D 3/00* (2013.01); *A46B 5/00* (2013.01); *A46B 2200/1066* (2013.01); *B29C 45/14336* (2013.01); *B29L 2009/008* (2013.01); *B29L 2031/425* (2013.01)

(58) Field of Classification Search
CPC .............. A46B 5/02; B25G 1/10; B25G 1/102
USPC ....... 15/143.1, 167.1; 16/430, 431, DIG. 12; 300/21
See application file for complete search history.

(56) References Cited

U.S. PATENT DOCUMENTS

| 2,837,381 | A | * | 6/1958 | Sarlandt ........................ 403/263 |
| 4,411,041 | A | | 10/1983 | Braga |
| 5,339,482 | A | | 8/1994 | Desimone et al. |
| 5,511,276 | A | * | 4/1996 | Lee ............................. 15/167.1 |
| 6,497,337 | B1 | * | 12/2002 | Kehe ............................ 220/378 |
| 2004/0010876 | A1 | * | 1/2004 | Kraemer ........................ 15/143.1 |
| 2004/0181889 | A1 | * | 9/2004 | Huber et al. .................. 15/143.1 |
| 2005/0104556 | A1 | | 5/2005 | Pfenniger et al. |
| 2006/0021173 | A1 | | 2/2006 | Huber et al. |

(Continued)

FOREIGN PATENT DOCUMENTS

| DE | 31 05 544 A1 | 6/1982 |
| DE | 195 35 134 A1 | 3/1997 |

(Continued)

*Primary Examiner* — Todd E Manahan
*Assistant Examiner* — Brianne Kalachi
(74) *Attorney, Agent, or Firm* — Oliff PLC

(57) ABSTRACT

The toothbrush has a handle, a neck and a head. In the handle there is a first hard component which has a metallic covering. At least in regions, the metallic covering has a covering of a second hard component.

15 Claims, 8 Drawing Sheets

(56) References Cited

U.S. PATENT DOCUMENTS

2006/0123574 A1* 6/2006 Storkel et al. ............... 15/143.1
2006/0150350 A1   7/2006 Pfenniger et al.

FOREIGN PATENT DOCUMENTS

| DE | 201 18 361 U1 | 2/2002 |
| EP | 1 530 955 A1 | 5/2005 |
| WO | WO 99/63859 A1 | 12/1999 |
| WO | WO 00/07482 A1 | 2/2000 |
| WO | WO 00/34022 A1 | 6/2000 |
| WO | WO 01/96088 A1 | 12/2001 |
| WO | WO 2004/043669 A1 | 5/2004 |

* cited by examiner

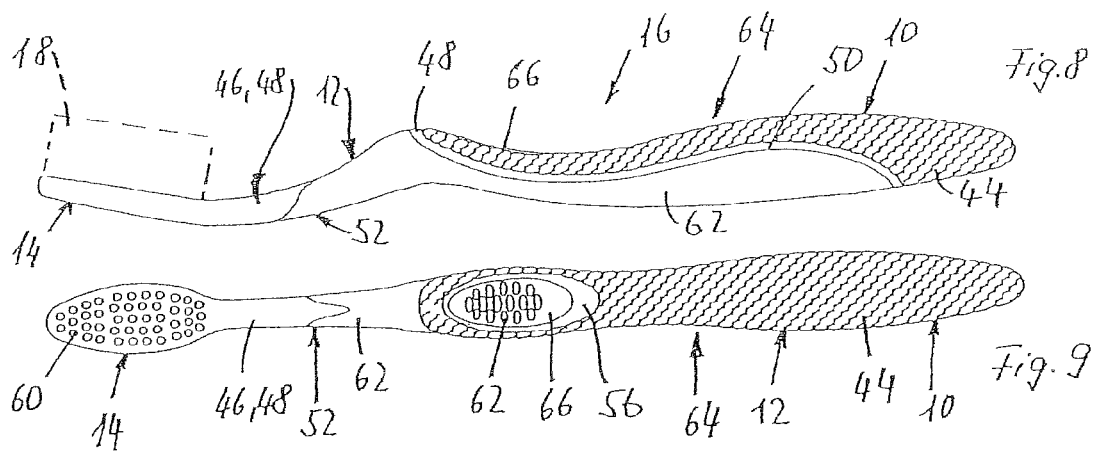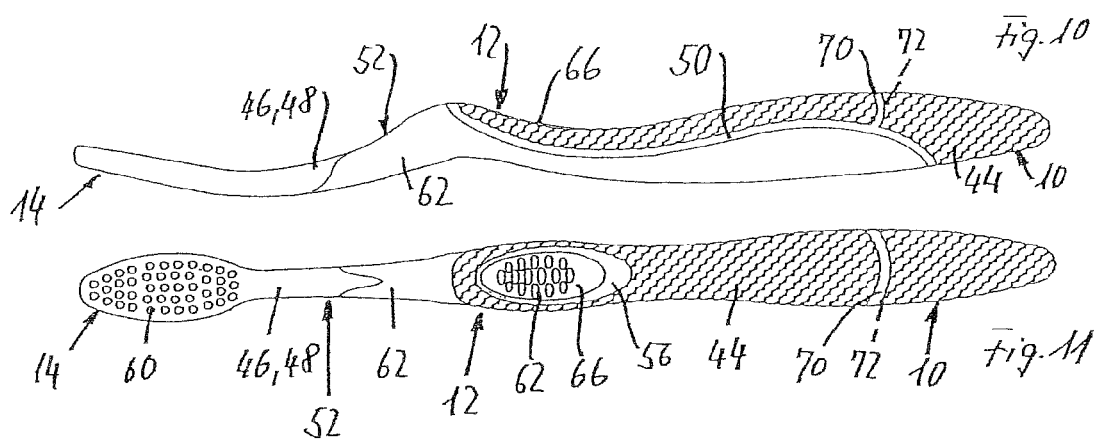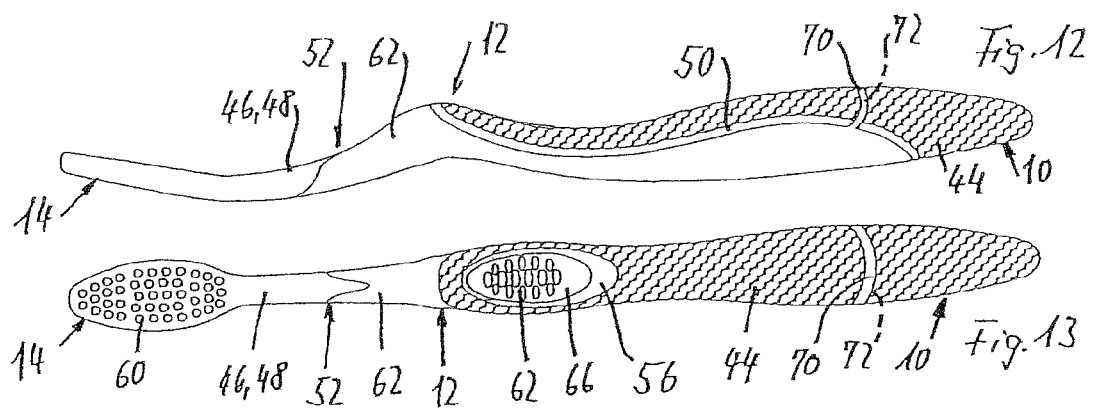

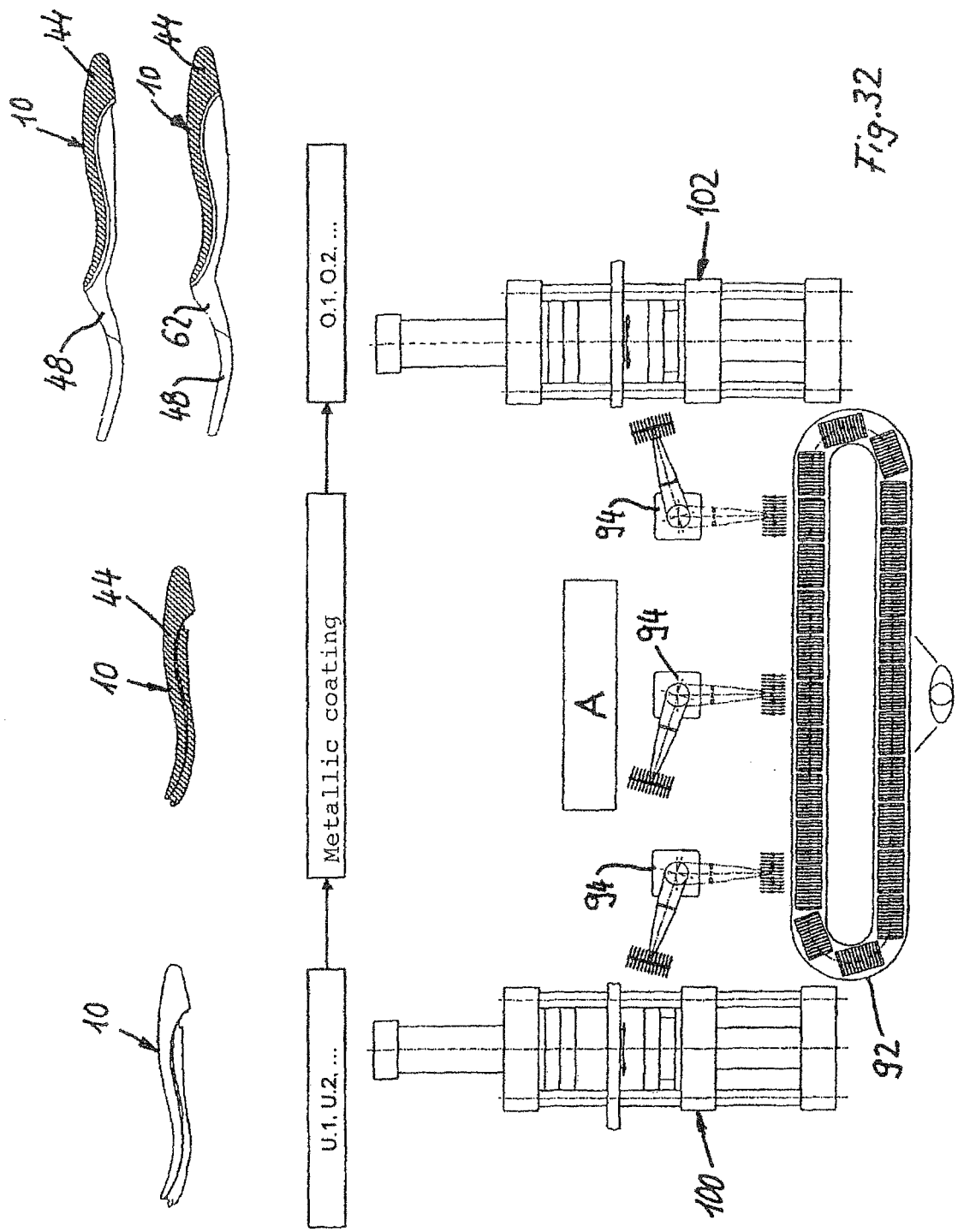

TOOTHBRUSH WITH PARTIALLY COATED SURFACE

The present invention relates to a toothbrush and to a method for producing a toothbrush according to the pre-characterizing clause of patent claim 1.

A toothbrush of this type is known from DE 31 05 544; it comprises a body produced from plastic, intended to act as a handle, and a head for carrying the bristles. By means of an electrogalvanic process, a layer of silver is applied over the full surface area, either only to the exchangeable head or, if the head is formed in one piece with the body, to the body and the head.

Galvanic processes or other metallic coating processes may be dependent on the use of toxic substances. It therefore cannot be ruled out that toxic substances remain behind on the metallic surface as residual particles. For the user of such toothbrushes, this may cause the risk of toxic substances getting into the body as a result of contact and/or during use.

Furthermore, the presence of metal in the mouth can cause a painful electric shock if it comes into contact with, for example, amalgam fillings, as a result of a current flow caused by static charging.

According to DE 31 05 544 A1, the layer of silver in the head of the toothbrush is desired specifically to avoid the risk of infections in the oral cavity. If, contrary to this objective, the known toothbrush is formed in such a way that it does not have a layer of silver in the head, it would be necessary to mask the part of the toothbrush that is not coated with silver before the galvanic treatment—or possibly metallization by means of another process—which would involve great manual effort.

In WO 2001/096088 and the corresponding EP 1 289 729 B1, a method for producing a molding is disclosed with reference to a toothbrush. A shell of sheet-like metal, plastic or metal-plastic laminate or composite material, and having at least one hole, is placed in a first mold cavity of a first injection mold in such a way that it lies against the surface of the cavity. Then, plastics material is injected, so that the plastics material flows in contact with the shell previously placed in, the solidified plastics material is fixed to the shell and the shell forms at least part of the outer surface of the molding, or of the toothbrush. In this case, an opening running from the hole in the shell through the molding is also formed. The molding is introduced into a second mold cavity. During the injection operation which then follows, further material, a rubber-like material, flows into the opening and through it, in order to form part of the further material, which is exposed on the outer surface of the shell.

It is an object of the present invention to develop the known toothbrush and at the same time make production possible with little effort. Furthermore, it is an object to provide a corresponding method for producing a toothbrush.

This object is achieved with a toothbrush according to patent claim 1.

The toothbrush according to the invention may have in the handle part an outer, exposed surface, which is formed partly by a metallic coating of a first hard component and partly by at least one further plastic component, for example a second hard component and/or a further component, which covers the metallic coating, at least in certain regions. It is also conceivable that the further plastic component completely covers the metallic coating in the handle part. The metallic layer is in this case completely within the toothbrush body and is arranged between the first hard component and the second hard component, and possibly further plastic components, and is completely masked.

The covering of the metallic coating with a second hard component allows the metallic layer to be protected. This is of particular interest if this can prevent the provision of a layer of protective lacquer, as required in the case of CVD (Chemical Vapor Deposition), PVD (Physical Vapor Deposition) or sputtering metal coating processes, or if only a particularly thin, and consequently fragile, metal layer can be applied. Depending on the process, this may involve layer thicknesses of less than 1 micrometer.

The second hard component is in this case preferably translucent or transparent, in order that the metal layer can still be seen through the additional plastic component. The converse case is likewise possible. The metallic layer is applied to a translucent or transparent first hard component on the entire surface or part of the surface. Subsequently, a second transparent or opaque hard component entirely or partially covers the metallic coating of the first hard component.

In comparison with known toothbrushes with a toothbrush body which is completely provided with a metallic coating, the toothbrush according to the invention has not only an improved visual appearance and impression of value, but in particular an improved feel. In the case of the toothbrush according to the invention, on the one hand surface regions which require increased resistance can be formed by the metallic coating and on the other hand surface regions which are important for feel can be formed by the further plastic component. Alternatively or in addition, the second hard component may be used to simplify the production process. Instead of protective lacquers, in particular in connection with CVD, PVD or sputtering to produce the metallic surface, further plastic components may be provided over the metallic surface in a further injection-molding step.

The electrical conductivity of the metallic coating may be functionally used, for example in electric toothbrushes—or other electric personal care devices mentioned further below. For instance, it is conceivable to conduct current via the metallic coating from the handle part, in which a battery, a storage battery, a switch and the like are arranged, to the neck part or head part, where an electric functional element, for example a vibration element or an electric motor, may be accommodated. To avoid the disadvantages of metallic surfaces in those regions of the toothbrush that are introduced into the oral cavity, the metallic coating may be covered there by the second hard component or a soft component. The electrical conductivity of the metallic coating may also serve as an electrical connection to sensors and the like or as a switching contact or the like. The simultaneous touching of this switching contact and an electrical conducting element that is galvanically separate from it, for example with the hand, may lead to a closed circuit, which is interrupted again when the hand is taken away from the place concerned.

Moreover, it is possible with the metallic coating to form a reflective surface, for example on the handle part or on the rear side of the head part, which does not usually come into contact with the teeth. The reflective surface may be used, for example, for monitoring teeth cleaning; moreover, it is possible by a three-dimensional, non-planar shaping of the area carrying the metallic coating to achieve an englargement, reduction or distortion of the object to be viewed with the mirror. Also in this case it is proposed to overmold the metallic coating, at least partially, by means of preferably the second hard component.

Moreover, it may be possible, for example, to achieve an antibacterial effect by means of a metallic coating containing silver.

The metallic coating forms a coating on the surface of the voluminous, not thin-walled first hard component. The first hard component is formed in a tool by means of injection molding and does not comprise a molded sheet-like material. Consequently, the first hard component preferably has very differing wall thicknesses. This is in particular by contrast with the method known from WO 2001/096088 and EP 1 289 729 B1, where plastic is molded over a prefabricated shell of sheet-like material.

The present invention allows, in a first configurational variant, the first hard component to be completely provided with the metallic coating and nevertheless to achieve a surface that is not just metallic in the part of the toothbrush concerned. It is consequently possible to dispense with elaborate masking of regions of the hard component when producing the metallic coating. It is, moreover, also possible to dispense with such masking when the first hard component is only partially to be provided with a metallic coating. A sharp, precise boundary of the metallic coating is not necessary, since the boundary region of the metallic coating may be covered by the second hard component.

The second hard component may consist of the same plastics material as the first material component, provided with the metallic coating.

Since the first hard component in the handle part takes up a very significant proportion of the cross section of the handle part—also see claim 2 in this respect—the first hard component, provided with the metallic coating, can assume a carrying function and make reliable production possible, in particular by means of multi-component injection molding. The first hard component is usually produced by the injection-molding process, in particular by means of multi-component injection molding. As a result, the first hard component may have a mold parting line, which according to claim 3 is metallically coated. Apart from functional properties, a desired visual effect can also be thereby achieved.

In customary production processes, for example by means of multi-component injection-molding processes, a further plastic component can be directly molded onto or over a first hard component, so that these two components adhere to each other, i.e. enter into a connection with each other and form a material bond. This capability of entering into a bond or connection with each other during the multi-component injection molding can be lost as a result of the metallic coating of the first hard component, in spite of compatible materials. The metallic coating acts as it were as a release layer between the first hard component and the further plastic component.

This problem can be solved in a preferred way by the first hard component being provided with a metallic coating only in certain regions and by a second hard component or a soft component, which covers the metallic coating at least in certain regions, being connected to the first hard component in the coating-free zone by bonding produced in the multi-component injection molding. The first hard component, coated with the metallic layer, and the further plastic components in this case preferably consist of affinitive or compatible materials.

However, the aforementioned problem can also be solved by the second hard component having at least one zone which is free from the first hard component, and by molding on a further component, which enters into a material bond with the second hard component in the free zone.

A soft component molded onto the second hard component may lead to a particularly good feel, by the soft component being provided in particular at those places that are important for holding the toothbrush with the hand, such as for example in the region where the ball of the hand and the thumb rest.

FIG. 6 relates to a particularly preferred embodiment of the toothbrush in which the hard component is completely provided with the metallic coating on the surface.

To overcome the aforementioned problem of lack of bonding, according to claim 7 the second hard component is firmly connected to the hard component by mechanical, positive and/or non-positive connection, for example by means of a shrinkage connection. Such shrinkage connections between non-compatible hard materials are known, for example, from WO 00/34022 A1.

In a preferred embodiment of the toothbrush, according to claim 8, the soft component lies directly against the metallic coating, at least in certain regions.

On the one hand, very good bonding can be achieved between the soft component and the second hard component and on the other hand the soft component can protrude beyond the second hard component, and consequently lie directly against the metallic coating, without there being the risk of the second component becoming detached. This is so in particular if the protrusion of the soft component beyond the second hard component is chosen to be not all too great, or takes place only in the peripheral region of the hard component.

Particularly preferred possibilities for anchoring the second hard component to the metallically coated first hard component are defined in patent claim 9.

Particularly stable anchorage of the second hard component is specified in patent claims 10 and 11.

A further particularly preferred form of the fastening of the second hard component is defined by claim 12.

The particularly preferred embodiment of the toothbrush according to claim 13 prevents the penetration of liquid, in particular water, between the second hard component and the first hard component or the metallic coating thereof. On the one hand, as a result it is possible to form toothbrushes according to the invention also as electric toothbrushes and on the other hand the risk of germ formation can be reduced.

Claim 14 specifies particularly preferred methods for producing the metallic coating.

In order to solve the problems of bonding the metallic coating to the first hard component set out further above, the toothbrushes according to the invention are preferably formed according to claim 15.

In the case of particularly preferred toothbrushes, the bonding between the metallic coating and the second hard component or the soft component is improved.

Particularly suitable plastics for the first hard component and for the second hard component are specified in the disclosure.

To improve the bonding of the second hard component or the soft component to the metallic coating, adhesion promoters are used.

Particularly suitable adhesion promoters are specified in the below disclosure.

A particularly preferred cross section of the toothbrush is specified in the below disclosure.

A method for producing toothbrushes is specified in the below disclosure.

The method according to the invention for producing the toothbrushes may be carried out in-line or off-line.

A particularly preferred embodiment of the method makes it possible in a simple manner to produce toothbrushes according to the invention with particularly good feel.

The invention is explained in more detail on the basis of embodiments that are represented in the drawing, in which purely schematically:

FIG. 8 shows an elevation of the first hard component, provided with the metallic coating, and also the second hard component, which is molded onto the first and in the handle part and in the neck part is overmolded with a soft component; FIG. 8 consequently shows the finished toothbrush body without bristles, the covering with bristles in the head part being indicated;

FIG. 9 shows a plan view of the toothbrush body according to FIG. 8;

FIG. 10 shows an elevation of an embodiment of the toothbrush body very similar to FIG. 8, in which the second hard component reaches completely around the first hard component, provided with the metallic coating, in the circumferential direction with the aid of a strip-like fillet;

FIG. 11 shows a plan view of the toothbrush body according to FIG. 10;

FIG. 12 shows an elevation of an embodiment very similar to one of the embodiments according to FIGS. 8-11, but the soft component reaching completely around both the first hard component, provided with the metallic coating, and the second hard component in the circumferential direction by means of a soft-component fillet;

FIG. 13 shows a plan view of the toothbrush body according to FIG. 12;

Figure 27:
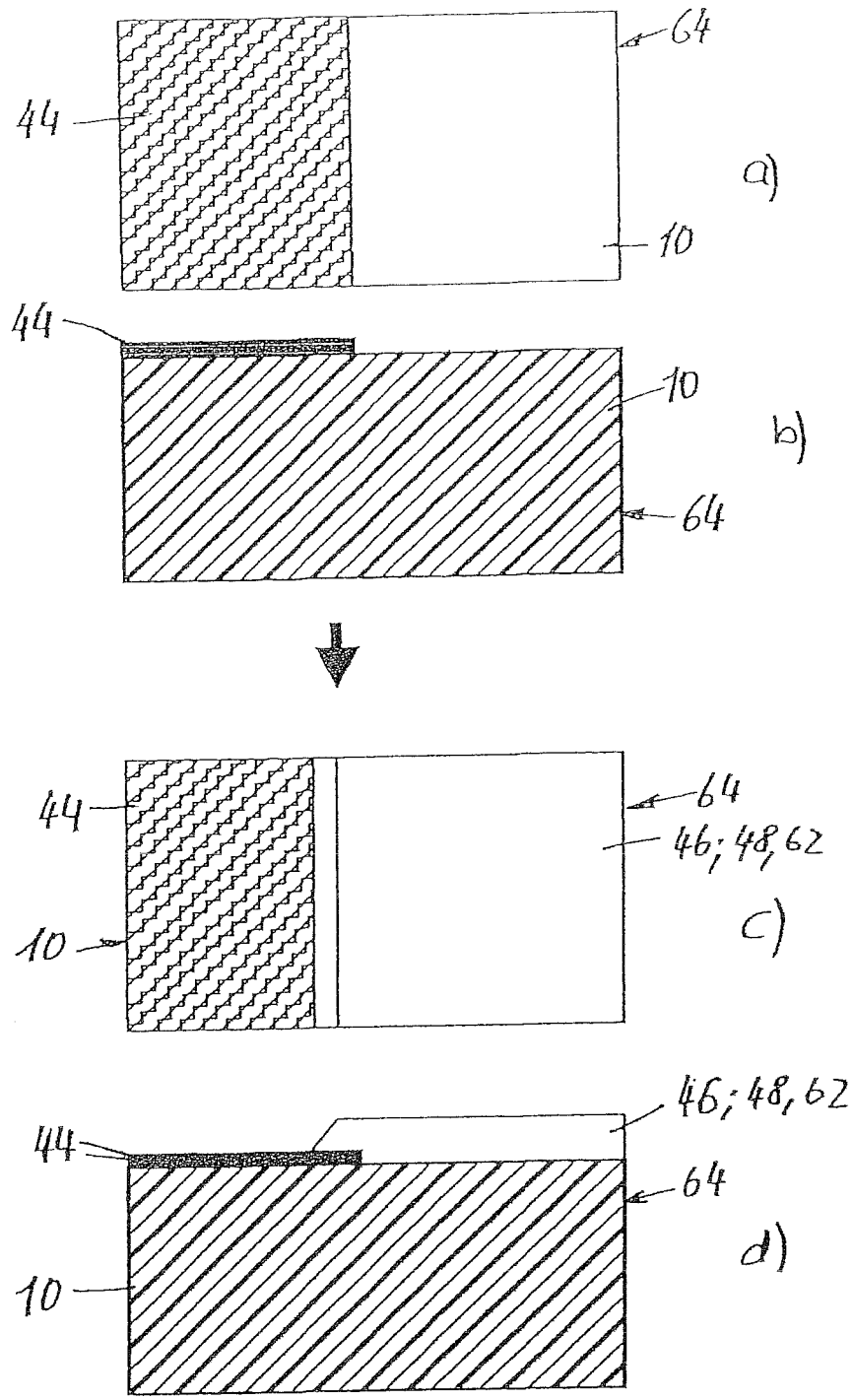
Figure 28:
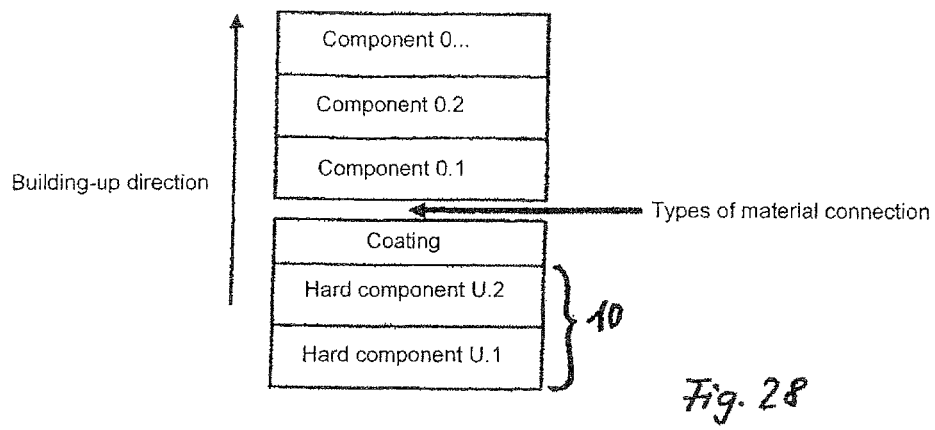
Figure 29:
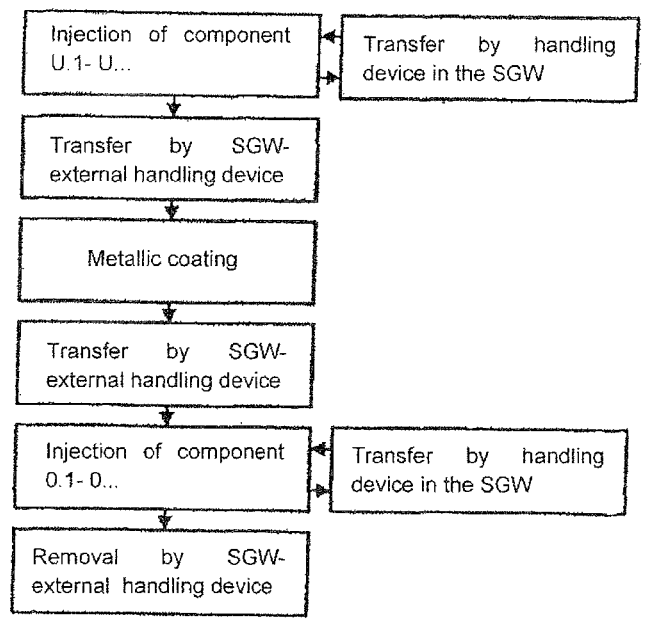
Figure 30:
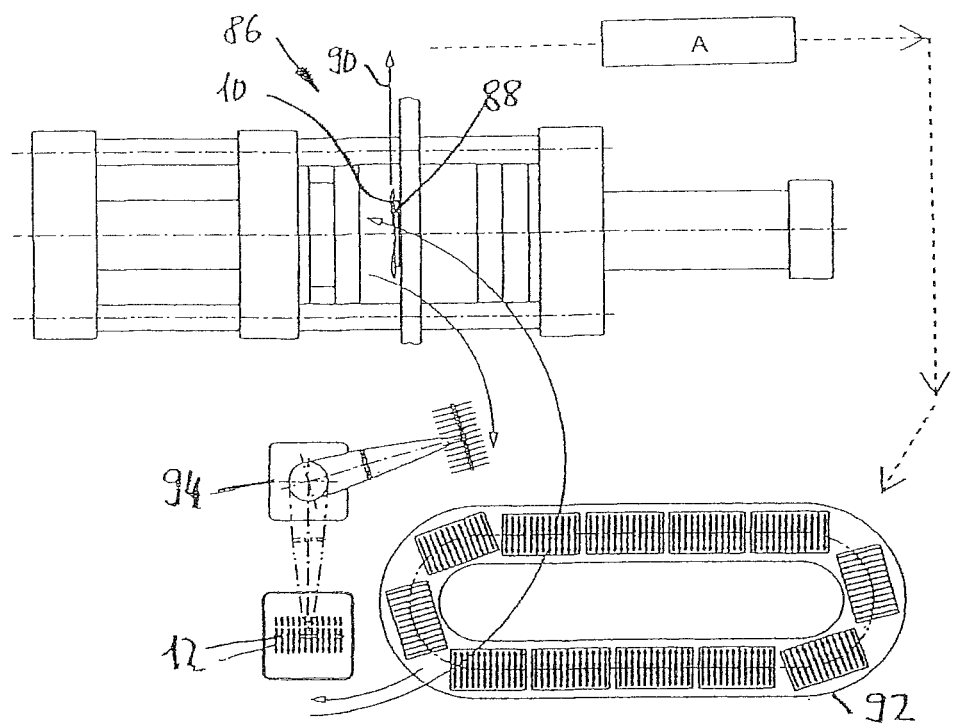
Figure 31:
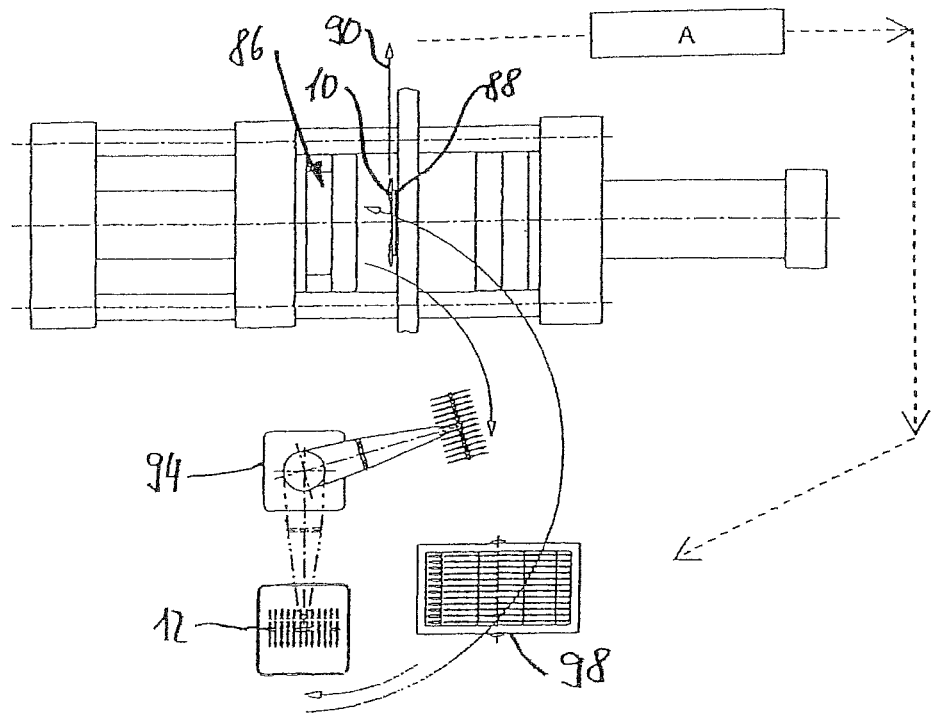

FIG. 27 *a*) shows a plan view and *b*) shows a section of/through a part of a first hard component partially provided with a metallic coating and *c*) shows a plan view and *d*) shows a section of/through the first hard component with a further plastic component molded onto it;

FIG. 28 shows a schematic representation of the build-up of toothbrushes according to the invention;

FIG. 29 shows a schematic representation of the method steps for producing a toothbrush according to the invention;

FIG. 30 shows a layout of an installation for producing toothbrushes according to the invention with a carousel;

FIG. 31 shows a further possible layout for a corresponding installation; and FIG. 32 shows a third possible layout for a corresponding installation, together with the schematic process sequence, in the middle, and the product produced in the respective step, at the top.

Figure 1:
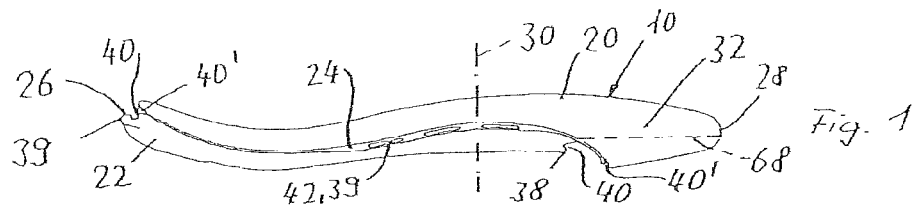
FIG. 1 shows an elevation of a first hard component, which is produced from plastic and in the finished toothbrush forms a major part of the handle part.
Figure 2:
FIG. 2 shows a plan view of the first hard component according to FIG. 1.

FIGS. 1 and 2 respectively show in an elevation and in a plan view a first hard component 10 for a toothbrush body 12, as the latter is shown in FIGS. 8 and 9. In a known way, the toothbrush body 12 is provided in its head part 14 with bristles 18 to form a complete toothbrush 16.

The first hard component 10 is produced from a hard plastic in a first cavity of a multi-component injection-molding tool or in a cavity of a single-component tool. The following shaping is given only by way of example; it goes without saying that similar or different forms are also conceivable.

In elevation, the first hard component 10 has a vaguely S-shaped form and between an upper part 20 and a lower part 22 of the one-piece first hard component 10 there extends a shoulder 24. Seen in elevation, the shoulder extends from a front end 26 of the first hard component 10 in an S-shaped manner laterally of the first hard component 10 in a rearward and downward direction, so that a rear end 28 of the first hard component is at a distance from the shoulder 24. In cross sections 30 extending at right angles to the longitudinal direction of the first hard component 10, the surface 32 of the upper part 20 is approximately semicircular and, in the region between the rearward end of the shoulder 24 and the rear end 28, approximately circular. As a result of the shoulder 24, the lower part 22 is set back inwardly with respect to the upper part 20, in a radial direction. The upper part 20 has in the region of its later thumb rest a depression 34, which is oval in plan view and from which a cross-sectionally elongate first anchoring clearance 36 and a cross-sectionally round second anchoring clearance 36' pass through the first hard component 10. It goes without saying that the position and direction of the anchoring clearances 36, 36' may vary according to the shaping of the first hard component. For example, anchoring clearances may penetrate the first hard component laterally or obliquely. The lower part 22 has from its rear end 38 to the first anchoring clearance 36 an approximately triangular cross section. Then, laterally of the first anchoring clearance 36, it goes over into an approximately rectangular cross section between the front end of the first anchoring clearance 36 and the front end 26 of the hard component 10. The second anchoring clearance 36' extends through this cross-sectionally rectangular part.

The lower part 22 is provided with an anchoring projection 39 at its front end and an undercut 40 at both the rear end 38 and the front end 26. Furthermore, the shoulder 24 forms a further undercut 40' both in its forward end region and in its rearward end region. Furthermore, the lower part 22 has on both sides, at a distance from the shoulder 24, three laterally protruding beads 42, which are arranged one behind the other in the longitudinal direction and in turn form anchoring projections 39. In the case of alternative shapings of the first hard component, these anchoring projections and/or undercuts may also be placed at other locations. They are preferably placed in the peripheral region of the first hard component—and a second hard component—such that a desired shrinkage connection already takes effect as much as possible in the peripheral region of the hard components.

Figure 3:
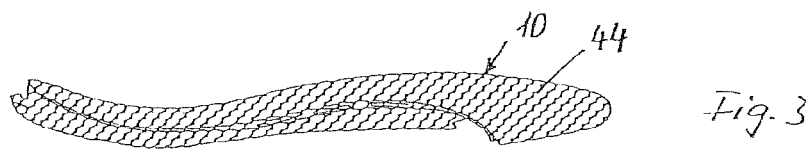
FIG. 3 shows an elevation of the completely metallically coated first hard component.
Figure 4:
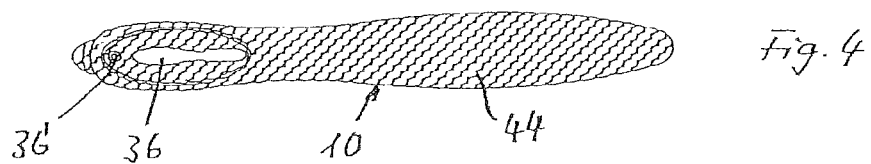
FIG. 4 shows an elevation of the completely metallically coated first hard component according to FIG. 3.

In a second method step in this configurational variant, the first hard component 10 is completely provided with a metallic coating 44. This is so in particular when working with galvanic methods by means of immersion baths. As indicated in FIGS. 3 and 4 by the "thermal insulation" hatching.

The metallic coating 44 is also highlighted by this hatching in the other figures.

If working with CVD (Chemical Vapor Deposition), PVD (Physical Vapor Deposition) or sputtering, it is possible by masking to apply the metallic coating 44 only in certain regions or on one side. In this case, alternatively, it may be that only those subregions of the surfaces of the first hard component 10 that are covered by a second hard component are metallically coated.

In a third method step, the first hard component 10, provided with the metallic coating 44, is placed into a second cavity of the multi-component injection-molding tool—or into the first cavity of a further separately operated tool—in such a way that at least part of the surface, in this case the upper part 20, lies against the cavity wall.

However, the portion of the surface of the first hard component 10, provided with an at least partially metallic coating 44, that is lying against the cavity may also be an uncoated portion of the surface of the first hard component 10.

A further plastic component 46, in the present case a further hard plastic, is injected into the second cavity, in order in this way to produce a second hard component 48. This encloses or covers at least part of the first hard component 10—in this case the lower part 22 of the first hard component—completely and forms a strip-shaped bead 50 along the shoulder 24, the outer surface of this strip-shaped bead 50 being flush with the surface 32 of the upper part 20. The second hard component 48 has entered into positive connection with the anchoring projections 39, undercuts 40, further undercuts 40' and beads 42 and, as a result of the shrinkage behavior of the hard plastic during cooling and curing, also entered into a non-positive connection with the first hard component 10, provided with the metallic coating 44. The first hard component and the second hard component 48 are consequently firmly connected undetachably to each other exclusively in a mechanical manner—without forming a material bond; see in this respect FIGS. 5, 6 and 7. This mechanical firm connection is used with particular preference, since a secure anchorage can be produced between the hard components 10 and 48 irrespective of the material compatibility and the size of the metallic coating 44. This is by contrast with the prior art, in which a material bond is a prerequisite.

The second hard component 48 forms the carrying part of a neck part 52 of the toothbrush body 12 and the head part 14 thereof. Furthermore, the second hard component 48 passes through the first and second anchoring clearances 36, 36' by means of material bridges 54 and forms a surface-area covering 56 in the depression 34. A passage 58 remains free through the material bridge 54 penetrating the first anchoring clearance 36. Also as a result of the material bridges 54, the surface-area covering 56 is undetachably fixed and, as a result of the shrinkage behavior, lies against the metallic coating 44 without any gap and with a waterproof effect, or in the case of an only partial metallic coating 44, lies against the first hard component 10.

Figure 6:
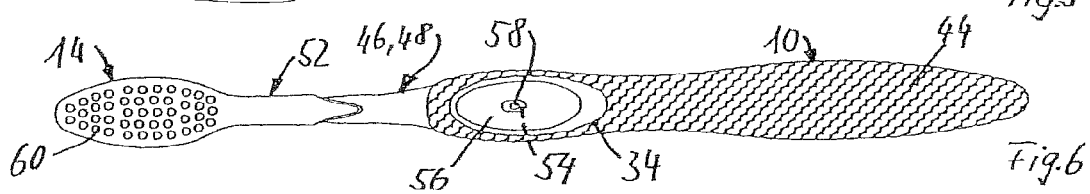
FIG. 6 shows a plan view of the first hard component, provided with the metallic coating, and the second hard component according to FIG. 5, which is molded onto the first.

In FIG. 6, the bristle cluster receiving holes 60, which are like blind holes and are open in the direction of the upper side of the toothbrush 16, can be seen in the head part 14. It goes without saying that the covering with bristles can also be produced by means of other methods, such as for example by means of the AFT (Anchor Free Tufting) or IMT (In Mold Tufting) methods known in the sector. It is advisable if, in the processes in which bristles or bristle carriers are fixed to the toothbrush handle by means of injecting plastics, the overmolding of the first hard component, provided with the metallic coating 44, is performed in the same operation and with the same plastic component as the fixing of the bristles or bristle carriers.

Figure 5:
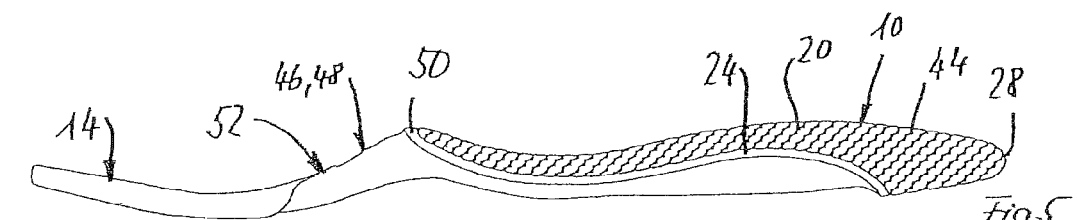
FIG. 5 shows an elevation of the first hard component, provided with the metallic coating, and a second hard component, which is molded onto the first and also forms the carrying part of the neck part and the head part of the toothbrush.
Figure 7:
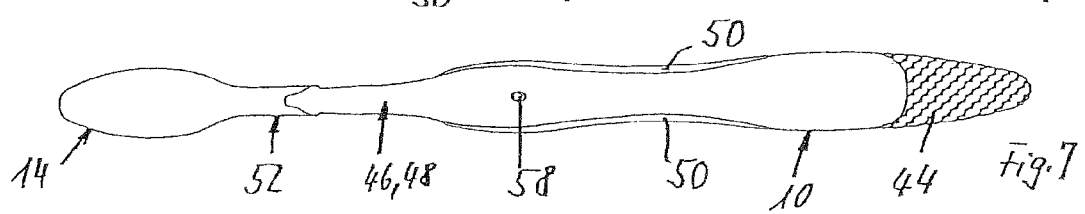
FIG. 7 shows a view from below of the first hard component, provided with the metallic coating, and the second hard component according to FIGS. 5 and 6, which is molded onto the first.
Figure 14:
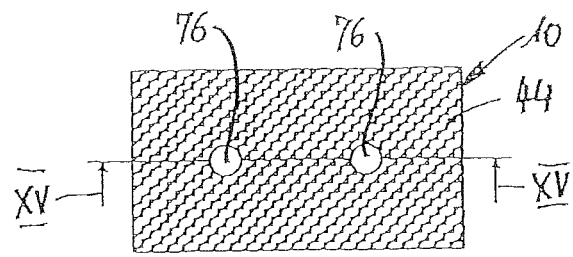
FIG. 14 shows a plan view of a detail of the first hard component, provided with the metallic coating and having two openings, which are connected to each other via a tunnel in the first hard component.
Figure 15:
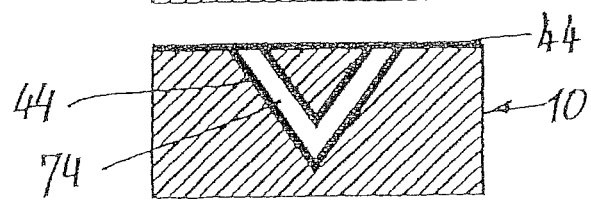
FIG. 15 shows a section along the line XV-XV of FIG. 14 through a portion of the first hard component, provided with the metallic coating, and the tunnel.
Figure 16:
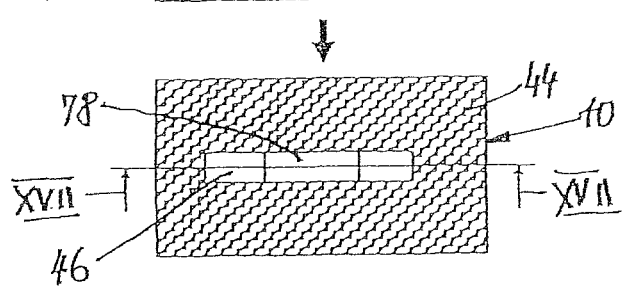
FIG. 16 shows a plan view of the part shown in FIGS. 14 and 15 with a further plastic component which is injection-molded into the tunnel, covers the two openings and forms a closed ring together with the further plastic in the tunnel.
Figure 17:
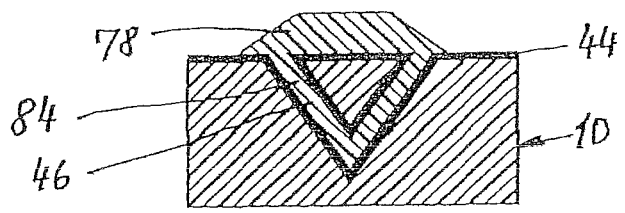
FIG. 17 shows a section along the line XVII-XVII of FIG. 16 through the detail concerned of the first hard component with the further plastic component, which forms a completely closed ring.

The molding produced to this extent according to FIGS. 5 to 7 is then transferred into a further cavity of the multi-component injection-molding tool—or into a further single-component tool—into which a soft plastic is then injected to form a soft component 62; see FIGS. 8 and 9. The soft component 62 enters into a bond—also referred to in the present context as a material bond—with the second hard component 48, as a result of the use of affinitive, i.e. compatible, plastics and, in the handle part 64, covers the second hard component 48 completely, with the exception of the outer surface of the strip-shaped bead 50, and encloses the second hard component 48 in the neck part 52 between the handle part 64 and approximately the middle of the neck part 52. Moreover, the soft plastic has flowed through the passage 58 onto the upper side of the toothbrush body 12, has entered into a bond—a material bond—there with the surface-area covering 56 comprising the second hard component 48 and forms a thumb rest 66 provided with nubs.

The completed toothbrush body 12, as it is shown in FIGS. 8 and 9, is removed from the injection-molding tool and, depending on the method of attaching bristles, is also fed to a tufting station. The bristles 18 are schematically indicated in FIG. 8.

In the case of the first hard component 10, the mold parting line 68 extends along the shoulder 24 almost as far as the rear end 38 and from there along the line 68 indicated by dashed lines; compare FIG. 1. The metallic coating 44 extends uninterruptedly over the mold parting line 68.

The toothbrush body 12 of a second embodiment of a toothbrush according to the invention, represented in FIGS. 10 and 11, is formed in precisely the same way with the exception of a fillet 70 and is produced by the same method as described further above in connection with FIGS. 1 to 9. The fillet 70 comprises the second hard component 48 and connects the peripheral strip-shaped bead 50 through a corresponding groove 72 of the upper part 20, provided with the metallic coating 44, in such a way that, in a cross section near the rear end of the second hard component 48, the latter completely encloses the first hard component 10 with the metallic coating 44 in the circumferential direction. This fillet 70 may of course vary in form, position and number, dependent on the embodiment. In addition, by analogy with the method discussed above, the fillet may also be at least partially covered by the soft component 62 bonded to the second hard component 48.

The embodiment of the toothbrush body 12 that is shown in FIGS. 12 and 13 corresponds to that according to FIGS. 10 and 11, but with the fillet 70 now being formed only by the soft component 62. For this purpose, the strip-shaped bead 50 is interrupted, at least partially or at least superficially, in extension of the groove 72, so that the soft plastic can flow into the groove 72 during the injection molding. Since the soft component 62 does not enter into a connection with the metallic coating of the first hard component 10 without further intervention, the soft component 62 is preferably let into the surface of the metallically coated first hard component 10. This prevents partial detachment of the soft component 62.

FIGS. 14 to 17 show a further possibility for fastening, for example of a thumb rest 66 or other regions formed by further components 46, to the first hard component 10, provided with the at least partial metallic coating 44. This first hard component has as an anchoring clearance a tunnel 74, which when seen in section is formed in a V-shaped manner or at least such that it can be removed from the injection-molding tool and opens out onto the surface at openings 76. Since the first hard component 10 is covered by the metallic coating 44, the wall of the tunnel 74 extending inside the hard component is formed by the metallic coating 44. To form a further plastic component 46, a soft or hard plastic is injected into the tunnel 74 and forms an outer bridge 78 on the metallic coating 44. The further plastic component 46 consequently forms a triangular, completely closed ring within the first hard component 10, whereby said ring is firmly anchored on the first hard component 10. As an alternative to the V-shaped form given by way of example, it goes without saying that material bridges of other forms that are effectively connected to the surface and closed may also be formed. As a result of the shrinkage behavior of the further plastic component, the bridge 78, forming for example a thumb rest, lies flush against the metallic coating 44. Furthermore, the bridge 78 may form an island which is surrounded by the metallic coating 44. However, it is also possible that the anchorage is used for forms in which the materials are applied to the metallic surface in the manner of tongues.

Figure 18:
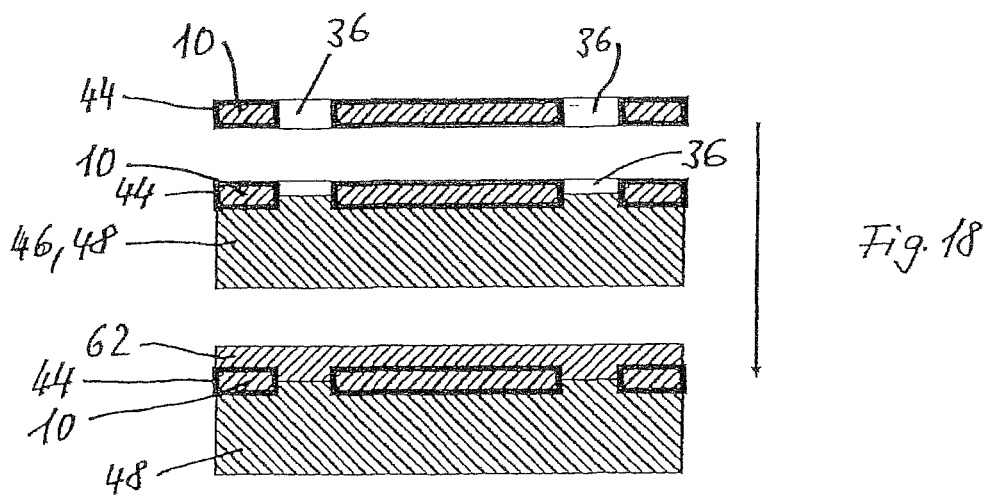
FIG. 18 shows a schematic representation of three method steps in the production of a toothbrush according to the invention.

FIG. 18 schematically shows a further possibility for fixing a second hard component 48 and a soft component in a first hard component 10, provided with a metallic coating 44. As can be seen from the uppermost representation in FIG. 18, the first hard component 10 has two continuous anchoring clearances 36 in the form of passages. The first hard component 10 is metallically coated.

As indicated in the middle representation, the further plastic component 46, in the present case a second hard component 48, is molded onto one side of the first hard component 10 provided with the metallic coating 44. This further plastic component reaches approximately midway into the anchoring clearances 36. This anchoring clearance 36 may be configured in such a way that the second hard component 48 mechanically anchors to it, for example it may be set up trapezoidally in cross section, the clearance opening toward the further soft component 62 in a funnel-like manner.

Subsequently, as the lowermost illustration of FIG. 18 shows, a third plastic component, in the present case a soft component 62, is molded on by the multi-component injection-molding process on the other side of the first hard component 10. On account of the affinity of the two plastics, this soft component 62 enters into a stable bond, a material bond, with the second hard component 48 in the anchoring clearance 36. However, it is also possible that a further hard component represents the third plastic component.

Figure 19:
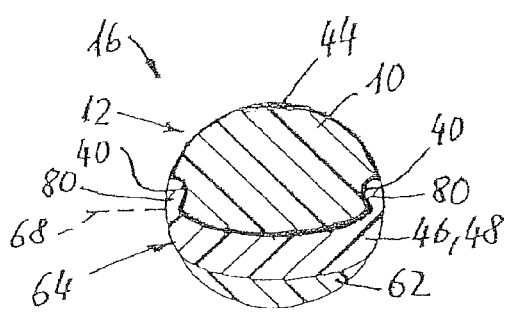
FIGS. 19-26 show different possible cross sections through the handle part of toothbrushes according to the invention.

FIG. 19 shows a cross section through the handle part 64 of the toothbrush body 12 of a toothbrush 16, which has similar cross sections to the toothbrush shown in FIGS. 8 and 9. The first hard component 10 is provided at least partially, in the cross section shown completely, with a metallic coating 44 (thick line in the peripheral region). It has a voluminous, in this example virtually semicircular, cross section, with groove-like undercuts 40 that extend in the longitudinal direction of the toothbrush being provided in the transitional region from the slightly curved base to the circular-cylindrical shell. Alternatively, it is also possible of course for anchoring projections to be provided, as also shown in FIG. 1. In the region of said shell, the metallic coating 44 can be seen in this embodiment and comes to the surface of the toothbrush. Alternatively, the metallic coating 44 may be applied only in a region of the common surface between the first hard component 10 and the second hard component 48 on the first hard component 10. In the region of the base and the undercuts 40, the second hard component 48 is molded around or onto the first hard component 10. Said second hard component engages with a wall-like lip 80 into the undercuts 40 and, as a result of the geometry of the arrangement and its shrinkage behavior, forms a firm mechanical, positive and non-positive connection with the first hard component 10. The lower surface of the second hard component 48 extends approximately parallel to the base of the first hard component 10. The second hard component 48 may be transparent or translucent, in order that the metallic coating 44 remains visible through the second hard component 48.

A soft component 62 is molded onto the surface of the second hard component 48, likewise by the multi-component injection-molding process. Since affinitive materials are used, i.e. materials which are compatible and connect to one another, this soft component 62 enters into a bond, a material bond, with the second hard component 48. In the cross section shown, the toothbrush body 12 has by way of example virtually the form of a circle. It goes without saying that the cross section may assume an elliptical form or other round form in all the examples.

It goes without saying that the way in which the surface area of the cross section is divided up in this or other figures is only given by way of example. The form of the surface area of the components and the way in which it is divided up, as well as the outer form of the cross section or of the toothbrush, may turn out to be different without departing from the scope of the invention, with the way in which the cross section is made up preferably being retained.

It is also expressly emphasized that the cross section only behaves in a way corresponding to the figures in individual regions of the toothbrush. It goes without saying that cross sections in other regions of the toothbrush may look different. It is also possible to combine individual properties or combinations, or ways in which the surface area of the components are divided up, of individual cross sections that are shown with other cross sections that are shown. The individual cross sections may also be turned in their position or orientation without departing from the scope of this invention.

The soft component 62 is at least partially only in contact with the second hard component 48 and only this second hard component is in contact with the metallic coating 44 of the first hard component 10.

It is also conceivable to allow the base of the first hard component 10 to protrude further beyond the mold parting line 68 into the second hard component 48, so that it ends nearer the soft component 62. In the cross section shown in FIG. 19, the first hard component 10 takes up a significant proportion, for example approximately half, of the entire cross-sectional area.

Figure 20:
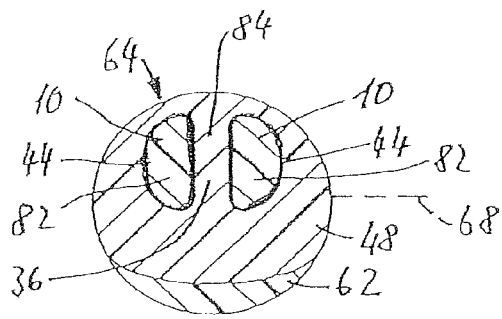

In the cross section shown in FIG. 20, through the handle region of a toothbrush 16, the metallic coating 44 of the first hard component 10 does not reach as far as the outer surface of the handle region. In this section, the first hard component 10 has two parallel arms, which extend in the longitudinal direction of the toothbrush and are formed symmetrically in relation to a longitudinal center plane and approximately semicircular-cylindrical in cross section. The form, position and number of the arms are in turn depicted by way of example and may deviate from the figure without departing from the scope of the invention. The two metallically coated arms 82 are completely enclosed by the second hard component 48. In the region between the two arms 82, the second hard component 48 consequently forms a material bridge 84; the two arms delimit a continuous anchoring clearance 36. Preferably, a translucent or transparent second hard component 48 is used in this case too.

A soft component 62, by way of example crescent-like in cross section, is molded onto a lower surface region of the second hard component 48. As a result of the use of affinite materials in the multi-component injection-molding process, the soft component 62 adhesively bonds to the further hard component 48. The soft component 62 does not contact the metallic coating 44. The cross section of the handle part 64 is in turn depicted by way of example only as circular. In the cross section shown, the two arms 82 of the first hard component 10 take up about 20% of the entire cross-sectional area. Depending on the position of the cross section, this proportion may also be significantly higher.

Seen in the axial direction, at a distance from the cross section shown, the two arms 82 may unite and consequently form an anchoring clearance 36, described further above. It goes without saying that it is also possible to form cross sections with three or more arms.

Figure 21:
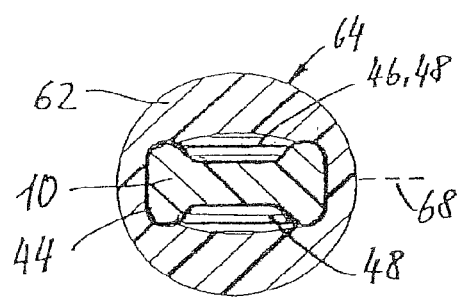

In the case of a further possible cross section, shown in FIG. 21, through the handle part 64, the first hard component 10 has by way of example an H-shaped cross section and is in turn provided at least partially, in the cross section shown completely, with a metallic coating 44. In the multi-component injection-molding process, the second hard component 48 is injected into the two trough-like spaces that are formed by the first hard component 10. The soft component 62, which is subsequently likewise molded on by the multi-component injection-molding process, completely surrounds the first hard component 10 with the second hard component 48 and enters into a bond, a material bond, with the latter and on both sides contacts the metallic coating 44 in the region that is not covered by the second hard component 48. Again by way of example, the cross section of the handle part 64 is circular, and the first hard component 10 takes up approximately 30% of the cross-sectional area. The parting of the mold is indicated by 68.

In order to fasten the two parts of the second hard component 48 additionally to the first hard component 10, it is possible to form anchoring clearances or anchoring projections on the first hard component 10 at a distance in the axial direction from the cross section shown, or to connect the two parts to each other by a material bridge 84 in a way analogous to FIG. 20. What is important about this cross section is that the soft component 62 can enclose at least part of the first hard component 10, provided with the metallic layer, in that the soft component 62 enters into a connection with the second hard component 48 by means of multi-component injection molding in at least one cross-sectional region, but without entering into a material bond with the first hard component 10 provided with the metallic coating 44. In this case, it is likewise proposed to use a translucent or transparent soft component 62 in order to be able to see the metallic coating 44.

Figure 22:
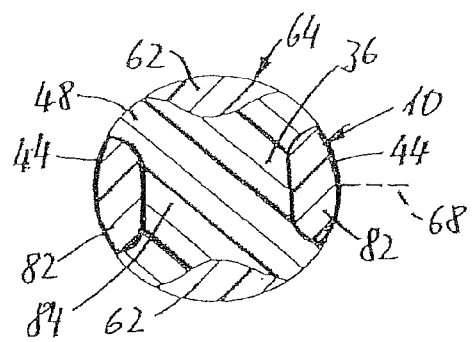

In the case of a further embodiment, shown in cross section in FIG. 22, the first hard component 10 has in turn by way of example two arms 82, which are formed symmetrically in relation to a longitudinal center plane and the radially outer surface of which lies at the periphery of the circular cross section of the handle part 64. The two arms 82 are spaced apart from each other and they are likewise provided at least partially, in the cross section shown completely, with the metallic coating 44. Consequently, in the cross section shown, the metallic coating 44 can be seen on both sides of the handle part 64 of the toothbrush. The two arms 82 delimit a wide continuous anchoring clearance 36, which is filled with the second hard component 48 by means of multi-component injection molding. In the region of the anchoring clearance 36, the second hard component 48 forms a material bridge 84, protruding from the upper and lower ends of which on both sides are fillets, which reach around the arms 82 up to the periphery of the cross section. The cross section of the second hard component 48 is substantially X-shaped. The position, number and form of the arms are given by way of example and may differ, depending on the position of the cross section. By analogy with previous cross sections, anchoring clearances and/or anchoring projections may be provided for anchoring the second further hard component on the first hard component 10.

A soft component 62 is attached to the second hard component 48, on top and underneath, by means of multi-component injection molding. As a result of the use of affinitive materials, the soft component 62 adhesively bonds to the second hard component 48. The parting of the mold is indicated by 68. The number and position of the arms and their shaping and proportion of the cross sectional area can again vary in the longitudinal direction. Alternatively, the soft component 62 may be absent on top or underneath. In its place, the second hard component 48 may take up a greater part of the cross section.

Figure 23:
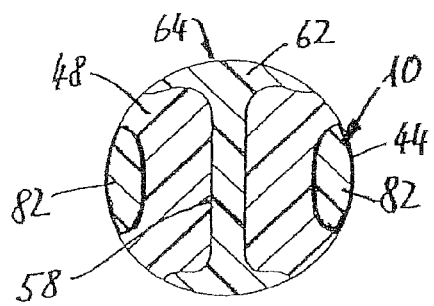

In the case of a further possible cross section through the handle part 64 that is shown in FIG. 23, the first hard component 10 has in turn, by analogy with the embodiment according to FIG. 22, two arms 82, which are coated at least partially, in the cross section shown completely, by a metallic coating 44, which can be seen on the two sides of the cross section. In a way similar to that described in connection with FIG. 22, the two arms 82 are surrounded by the second hard component 48 up to the periphery of the cross section. However, a passage 58 extends centrally through this second hard component from the top downward. By means of multi-component injection molding, this passage is filled with a soft component 62, which has the form of an H in cross section and reaches partially around the second hard component 48. Viewed from the surface, extending alongside and above and below the metallic coating 44 are strips of the second hard component 48, which are adjoined on top and underneath by the soft component 62.

Figure 24:
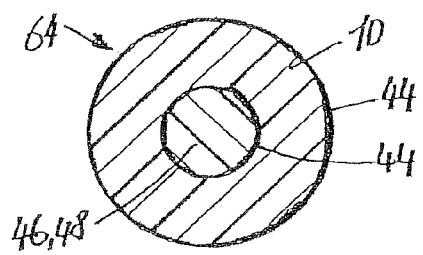

In the case of the cross section shown in FIG. 24, the first hard component 10 is formed by way of example in the form of a circular ring and in turn is provided at least partially, in the cross section shown completely, with the metallic coating 44, on the inside and/or outside. The inner space delimited by the first hard component 10 is filled, at least partially, in the cross section shown completely, with the second hard component 48 or the soft component 62. The anchoring of the further plastic component 46, i.e. the second hard component or the soft component 62, on the first hard component 10 takes place in another cross section, for example by means of anchoring clearances or anchoring projections.

Figure 25:
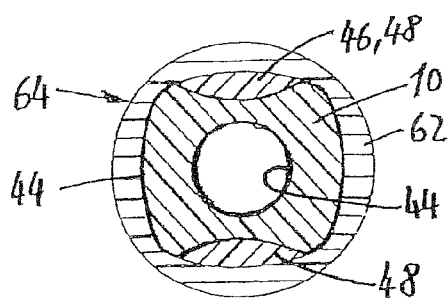

FIG. 25 shows a cross section through the handle part 64 of a toothbrush 16, which can be used in the present form in particular in the case of an electric toothbrush or an electric personal care product. The first hard component 10 has an annular cross section, the inner periphery being, for example, circular and the outer periphery being, for example, virtually square; however, the upper and lower sides are concavely formed and the two other, mutually opposite sides are convexly formed. The form of the first hard component 10 and its proportion of the surface area can in turn vary, depending on the position of the cross section. The first hard component 10 is in turn provided at least partially with a metallic coating 44, on the inside and/or outside, and the hollow space formed by it may be intended, for example, for receiving a battery, a storage battery or other electric functional components. In a way similar to the embodiment according to FIG. 21, the trough produced by the concave form of the first hard component 10, lying on top and underneath, is filled with the second hard component 48. The outer contour of the first hard component 10 and of the second hard component 48 virtually form a circle in this example. This circle is completely surrounded by a soft component 62, applied by the multi-component injection-molding process. It goes without saying that the soft component 62 could also cover only part of the surface.

The hollow space in the first hard component 10 may, for example, be formed by means of a core during the multi-component injection molding. However, it is also conceivable to produce the first hard component 10 in two half-shells, which are connected to each other in a known manner (welding, gluing, by means of overmolding with a further plastic component), forming the common hollow space. In particular when half-shells are used, it is possible for the hollow space to be completely enclosed by the hard component 10. However, it is also conceivable to leave the hollow space open or close it by means of a cover.

Furthermore, it is possible that a number of separate or connected hollow spaces are formed in a body. The hollow spaces—or the hollow space—may be open on one side or two sides or be closed by means of a covering element.

In principle, there is also the possibility of providing one or more hollow spaces by analogy with FIG. 25 in the case of the embodiments according to FIGS. 19-26. For this purpose, the hollow space or hollow spaces would preferably be placed in one of the hard components 10 or 48. The soft component 62 may likewise be used, but is less suitable for the positioning of electric components on account of the flexibility.

Figure 26:
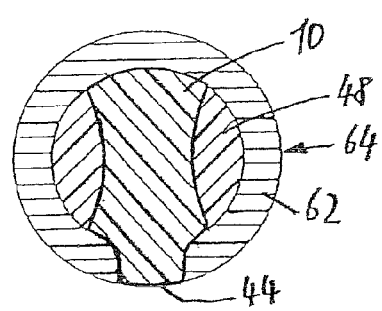

In the case of the cross section shown in FIG. 26, the first hard component 10 extends by way of example with a virtually rectangular cross section in the longitudinal direction of the toothbrush. The upper and lower sides of the first hard component 10 are formed concentrically with respect to the axis, the lower side lying at the periphery of the cross section of the handle part 64 and the upper side extending further inward in a radial direction. In the middle region, the sides of the first hard component 10 lying on the right and left in FIG. 26 are concavely formed at the top and bottom to a radius which corresponds to the upper side. The lower end of said concave formation is respectively adjoined by a further concave formation as far as the lower side of the first hard component 10, which is made shorter, measured in the circumferential direction, than the upper side. The first hard component 10 is covered at least partially, in the cross section shown completely, by a metallic coating 44. This metallic coating 44 is exposed in the region of the underside of the handle part 64. The clearances/troughs formed on both sides by the centrally arranged concave embodiment of the first hard component 10 are filled by the multi-component injection-molding process with a second hard component 48, which on the outside continues in a radial direction the circular form given by way of example of the upper side of the first hard component 10. Subsequently attached, radially on the outside, likewise by means of multi-component injection molding, is a shell of soft component 62, which embraces the upper side of the first hard component 10 and the second hard component 48 and reaches as far as the lower, exposed side of the first hard component 10. The soft component 62 enters into a bond, a material bond, with the second hard component 48, so that the first hard component 10 is partially, but firmly, enclosed. In a region where the soft component 62 contacts the metallic coating 44 of the first hard component 10 there is no material bond. It goes without saying that it is conceivable in the case of this embodiment to form the soft component 62 in another cross section such that it is completely closed in the circumferential direction, so that the lower side of the first hard component 10 is exposed in the manner of an island and is surrounded by the soft component 62.

Since the first hard component 10, the second hard component 48 and the soft component 62 are produced by means of injection molding, preferably multi-component injection molding, these parts can be given virtually any desired, three-dimensional volumetric forms. There is no limitation to the circular cross sections shown; the form of the cross section may vary in the arrangements and ways in which the surface area is divided up, while maintaining the concepts represented in FIGS. 19-26. For instance, the cross sectional form of the arms 82 may be differently configured, both in terms of outline and in terms of size/scaling.

For instance, it is possible to allow the cross sections shown to merge one into the other. Furthermore, it is conceivable in the case of all the embodiments shown to provide hollow spaces. Moreover, it is possible in the case of all the embodiments shown to replace the soft component 62 by a third hard component. In the case of all the embodiments shown, there is no bonding, or only negligible bonding, between the metallic coating 44 and the second hard component 48 or soft component 62, whereas the soft component 62 bonds to the second hard component 48, but not to the metallic coating 44 of the first hard component 10. The mechanical fastening of the second hard component to the first hard component 10 takes place by using the shaping and the shrinkage behavior of the second hard component 48. Possible measures for improving the bonding properties between the metallic coating 44 and the further plastic component 46 are described further below. However, these are less preferred, since they are complex.

It should be ensured that, as far as possible, the form of the first hard component 10 has no sharp outer edges (inwardly projecting and outwardly extending edges), since, for technical coating-related reasons, they represent a problem or a limit point on the surface. Such sharp edges can be smoothed by corresponding rounding of the edge. The individual portions of the material in the figures are also shaped in the manner of surface areas and not like sheets. In the case of all the figures, the individual hard components 10, 48 take up a significant proportion of the cross-sectional area. The cross-sectional area of the metallic coating 44 is negligible in comparison. In the case of all the figures, at least part of the metallic coating 44 is overmolded by a further component, and thereby covered.

As described in connection with the figures, the first hard component 10 does not have to be completely covered by the metallic coating 44. In particular, it is a preferred alternative in the case of all the figures to make the first hard component 10 translucent or transparent and to provide the metallic coating 44 only in the region or a subregion of the surfaces that are in contact between the first hard component 10 and the second hard component 48.

Individual surface elements of the first hard component 10 may be exposed and possibly enter into a connection, i.e. form a material bond, with the further components 46, 62.

FIGS. 27 a) and b) respectively show in plan view and in section a detail from the handle part 64 of a further embodiment of a toothbrush according to the invention. The first hard component 10 is in this case not provided completely, but partially, with the metallic coating 44. As FIGS. 27 c) and d) show, a further plastic component 46 is molded by means of multi-component injection molding onto the zone of the first hard component 10 that is free from the metallic coating 44; said further plastic component may be a second hard component 48 or a soft component 62. The use of affinitive, i.e. compatible, plastics results in a bonding between the first hard component 10 and the further plastic component 46. The further plastic component 46 covers the metallic coating partially, in the peripheral region.

In this document, the term multi-component injection molding comprises both the molding on of a number of different or identical plastic components in the same tool on one machine or the sequential injection molding of plastic components in different tools on different injection-molding machines.

FIG. 28 shows purely schematically the basic layer build-up of a toothbrush according to the invention. As described further above, the first hard component 10 may be produced from a single hard plastic in a single step. However, it is also conceivable that a first hard component U.1 is injected into a first cavity of a multi-component injection-molding tool, then the injection molding is transferred into a second cavity and a further portion U.2 of the same plastic or a different hard plastic is molded on there. In principle, it is possible to form the first hard component 10 from still more layers of the same hard plastic or from further layers of different, hard plastic. Different layers of different hard plastics may of course react differently in metallic coating methods, and consequently allow additional degrees of freedom in the coating process. The first hard component 10 formed in this way is provided with the metallic coating 44, which is indicated in FIG. 28 by "coating". The coated first hard component 10 is subsequently placed in a further cavity of the multi-component injection-molding tool, where a further plastic component 46, designated in FIG. 28 by "component O.1", is injected. This is preferably the second hard component 48, which serves as a basis for molding on a further hard or soft component, which is designated in FIG. 28 by "component O.2". It is conceivable to mold on a further plastic component, indicated in FIG. 28 by "component O . . . " in a further cavity, or to repeat the steps still further.

The hard material layers preferably lie underneath the soft material layers, or the hard material layers are injected before the soft material layers. FIG. 28 is also to be interpreted in conjunction with FIGS. 19-26. In particular, it is possible that the first hard components U.1 and U.2 directly contact the further components O.1, O.2, etc. If this contact takes place outside the metallic coating 44, a connection by means of a material bond may be produced in the multi-component injection molding. For example, the component O.2 may enter into a connection by means of a material bond with the hard component U.1 in a non-coated zone of U.1, this being in the case when affinitive plastics are used. When non-affinitive plastics are used, mechanical fastening is achieved by the shaping.

"Types of material connection" symbolize the wide variety of possibilities for fastening the component O.1 to the first hard component 10, provided with the metallic coating 44, for example mechanical positive and/or non-positive connection or else types of connection discussed further below.

The layer build-up shown in FIG. 28 can be achieved by the method steps as they are indicated in FIG. 29. In an injection-molding tool (SGW), the hard component U.1 is injected, or the hard components U.1, U.2 and possibly further hard components are injected one after the other, to form the first hard component 10, with the molding in each case being transferred into the next cavity of the multi-component injection-molding tool between individual injecting operations. The transfer is preferably carried out by a handling device or a robot, which in a known manner is built into or onto the injection-molding tool or is integrated therein. In the case of a build-up with different tools or injection-molding machines, there may likewise be an automatic connection, for example by means of a transporting system, between the cavities of the individual injection-molding tools. This transporting system may function directly by means of a chain or traction drive. A flexible solution, with a possibility of buffering between the individual injection-molding tools (for example shuttles), is preferred. It goes without saying that, with an automatic link between the injection-molding tools, the running-through times or cycle times between the individual stations match.

Once the first hard component 10 has been completed, it is removed from the injection-molding tool, preferably by means of an external handling device, and transferred to a conveying or depositing system, or put down therein. Then the metallic coating process takes place outside the injection-molding tool, to produce the metallic coating 44, the conveying or depositing system being specifically designed such that an optimum connection between the injection molding and the coating is created. The first hard component 10, provided with the metallic coating 44, is then in turn placed by means of an external handling device into the relevant cavity of the injection-molding tool, where the injecting of the component O.1 takes place. If a further component O.2 or still further components O . . . are to be molded on, a transfer is respectively performed in a known manner by the handling device of the injection-molding tool. The finished toothbrush body is removed from the latter by means of an external handling device. In the case of a set-up with different tools or injection-molding machines for the components O.1, etc., there may likewise be an automatic connection, a transporting system, between the cavities.

FIG. 30 shows purely schematically a possible apparatus set-up for carrying out the method explained in connection with FIGS. 28 and 29. In a multi-component injection-molding tool 86, the first hard component 10 is injected in one, two or more steps, the transfer within the injection-molding tool being performed by an internal handling device 88; the transfer could also be performed by an external handling device. The completed first hard component 10 is removed from the multi-component injection-molding tool 86 and put down by means of an external handling device 90. It may be put down in so-called trays, which have adapted holders for the first hard components 10. However, it is also conceivable to put the first hard components 10 down into containers without holders in an orderly fashion or to allow them to drop into the container in a disorderly fashion.

The first main components 10 are then fed to the station designated in FIG. 30 by A to produce the metallic coating 44.

It is conceivable that the first hard components 10 remain in the same receptacle (tray, container, suspension support, mount, grating, rack, grid, etc.) during the entire metallizing process. This has the advantage that the first hard components 10 do not have to be re-packed during the metallizing process. Alternatively, the first hard component 10 may also be removed from the receptacle by means of a handling system for the metallizing process and returned again after its completion.

In the example shown in FIG. 30, the first hard components 10, provided with the metallic coating 44, are returned to trays, which are fed to a circulating system or transporting system 92. In this system, the trays loaded with first hard components 10 are arranged one behind the other, it being possible to carry out further processes in the circulating system 92. For example, further elements, components or decorative steps could be implemented. A further external handling device 94, in the present case a robot, then respectively removes the coated first hard components from a tray and introduces them into the relevant cavities of the multi-component injection-molding tool 86. After introducing them in this way, the external handling device 94 takes over the completed toothbrush bodies 12 and puts them down in receptacles in an orderly or chaotic fashion. It goes without saying that it is conceivable to provide a conveyor belt, for example, instead of these receptacles 96, to feed the toothbrush bodies 12 directly to a tufting machine for attaching bristles. The task of the handling device 90 may also be undertaken by the handling device 94.

In the case of the device represented in FIG. 31 for producing toothbrush bodies 12 according to the invention, the only difference from the device according to FIG. 30 is that the first hard components 10, provided with the metallic coating 44, are not fed in trays to a circulating system 92, but are transferred to a magazine system 98, which is rotatable about a horizontal axis. The external handling device 94 takes over the coated first hard components 10, provided with the metallic coating 44, from this magazine system 98.

Instead of the single multi-component injection-molding installation used in FIG. 30, a number of injection-molding machines could be located at a larger circulating system and pass the injection moldings on to the next injection-molding step U.1, U.2 ..., O.1, O.2 ..., depending on the stage of the method, from the transporting system 92 by means of handling device 94.

FIG. 32 shows the schematic set-up of such an installation. In it, the method steps are also represented by way of example on the basis of the toothbrush according to FIGS. 1-9. The production of the first hard component 10 can be performed by a first injection-molding machine 100. As described in connection with FIG. 28, this may involve a number of injection-molding steps U.1, U.2, .... By way of example, the first hard component 10, represented in FIG. 1, is produced in FIG. 32 in only a single injection-molding step.

As shown in FIG. 32, method steps for the metallic coating and/or lacquering process to produce the metallic coating 44 may also be integrated 'in-line'(A), i.e. automatically linked by means of handling, in a further step on this transporting system 92. If necessary, this operating cycle may also be divided into a number of substeps automatically coupled to the transporting system 92 (primer, metallization, protective lacquer, etc.). Suitable in particular for this metallic coating process that is automatically linked with the injection-molding process are the CVD, PVD or sputtering process or the hot stamping process.

In a next step, the further plastic components O.1, O.2, ... are processed on a further injection-molding installation 102. The further second hard components and soft components 62 that are represented in FIGS. 5 and 8 are shown by way of example. The transporting system has individual circulating trays for receiving the injection moldings in the various stages of the method. This set-up allows a buffer section to be set up between the individual method steps in order to overcome minor disturbances. In this case, the trays are decoupled from the traction drive of the transporting system. The use of a strictly cycled circulating system is likewise possible, but less preferred. In this case, the tray or the work carrier would be coupled directly to the traction drive or the chain. Handling devices 94 or robots are designated by 94.

The following plastics are particularly suitable for producing the first hard component 10: polyvinyl chloride (PVC), polyamide (PA), polyester (PET), acrylonitrile butadiene styrene (ABS or an ABS blend), styrene acrylonitrile (SAN), polypropylene (PP), polycyclohexane dimethanol terephthalate (PCT; PCT-A (acid-modified); PCT-G (glycol-modified)), polyethylene (PE, such as for example BR003 from the Eastman Chemical Company), polystyrene (PS) or polymethylmethacrylate (PMMA). Polystyrene, acrylonitrile butadiene styrene or polypropylene with a modulus of elasticity of 1000-2400 N/mm$^2$, particularly preferably of 1300-1800 N/mm$^2$, is preferably used.

Polyvinyl chloride (PVC), polyamide (PA), polypropylene (PP), polyester (PET), polycyclohexane dimethanol terephthalate (PCT; PCT-A (acid-modified); PCT-G (glycol-modified)), polyethylene (PE, such as for example BR003 from the Eastman Chemical Company), polystyrene (PS), styrene acrylonitrile (SAN), polymethylmethacrylate (PMMA) or acrylonitrile. butadiene styrene (ABS or an ABS blend) are preferably used as the second hard component 48. Crystal clear plastics such as SAN, ABS or PS are preferably used as the second hard component 48, in order to show the metallized surface of the hard, component even if it is covered by the second hard component 48 by overmolding.

It should also be expressly mentioned that the same material can be multiply used for the material components U and O in FIG. 28—possibly with different additives such as dyes, metal particles, etc. For example, in a preferred variant, the first hard component 10, to be provided with the metallic coating, may consist of PP and the second hard component may likewise consist of PP. In the case of an at least partially transparent toothbrush handle, PS, SAN or ABS could be used for example as the first hard component 10. The second hard component could correspondingly likewise consist of PS, SAN or ABS.

Polyvinyl chloride (PVC), polyethylene (PE), of low density (LDPE, low-density polyethylene) or high density (HDPE, high-density polyethylene), rubber-elastic material such as polyurethane (PU), in particular thermoplastic elastomer (TPE), are suitable in particular for the soft component 62. The Shore A hardness of the soft component 62 is preferably below 90. Used with preference is a thermoplastic elastomer (TPE), which preferably enters into a connection with at least one of the hard components U or O.

It is particularly preferred for the first hard component 10 to be produced from transparent PET, PCT-A, PCT-G or ABS by means of injection molding and to be partially metallically coated by means of a CVD, PVD or sputtering process.

Subsequently, at least the entire region that is provided with the metallic coating 44 is overmolded by means of PP as the second hard component 48. The connection between the first hard component 10 and the second hard component 48 is realized without a material bond (without actual adhesive bonding of the material components) by means of positive and non-positive connection, by a shrinkage connection. In this case, the contact surface areas do not enter into any actual connection with one another. This fact can be easily established by cutting up the handle part.

Finally, a soft component 62 of TPE is molded onto the second hard component 48. The soft component 62 preferably covers the first hard component 10 only indirectly.

The toothbrushes or the toothbrush bodies 12 thereof have a length of up to 220 mm, for adults preferably of 190 mm-200 mm and for children of 120 mm-140 mm.

The length of the handle part 64 is between 45% and 65% of the overall length of the toothbrush or the toothbrush body 12. The remaining length is divided up between the neck part 52 and the head part 14, the length of the bristle zone preferably lying between 26 mm and 30 mm or between 15 mm and 24 mm.

The production of the metallic coating 44 on the first hard component 10 may be carried out for example by electrodeposition on the basis of a generally known method with the following steps:
1. Pickling operation: this involves treating the surface of the first hard component 10 in such a way that the bonding of the next layer is ensured.
2. Layer 1 of chemical nickel: a layer of 0.1 micrometer-0.5 micrometer of chemical nickel is applied to the pickled first hard component 10. This layer serves as a primer.
3. Layer 2 of electrolytic nickel: this nickel layer of 1 micrometer-5 micrometers likewise serves as a primer.
4. Layer 3 of copper: the copper layer has a thickness of 8 micrometers-30 micrometers and serves for reducing the tension on the surface.
5. Layer 4 of nickel: a further nickel layer of a thickness of 5 micrometers-20 micrometers is applied to the copper layer and makes the bonding of layer 5 possible. The configuration of this layer substantially determines the bright or mat appearance of the final coating.
6. Layer 5 of chromium/gold: chromium or gold is applied in a thickness of 0.1 micrometer-1 micrometer. This layer forms the outermost layer of the metallic coating 44 and determines the colored appearance of the coating.

A different layer build-up is conceivable. For example, nickel, which is toxic, may be replaced by nickel substitute materials, such as for example palladium. This allows the use of toxic contents for the coating to be substantially avoided, eliminating the problematic points of contact with toxically coated locations. Apart from a chromium-plated or golden surface, the metallic coating 44 may also leave the impression of being nickel-plated or copper-plated; the electrodepositing process and the layer build-up remain the same, but the procedure is terminated after providing layer 3 for a copper-plated surface and is terminated after applying layer 4 for a nickel-plated surface.

In the case of most of the embodiments shown further above, the first hard component 10 is provided with the metallic coating 44 completely. However, it is also conceivable not to immerse the first hard component 10 completely in the electrolytic baths—compare FIG. 27—so that the first hard component 10 is only partially coated. It is endeavored not to mask the first hard component 10 to obtain zones that are free from the metallic coating in the electrodeposition. In the case of an incomplete coating of the first hard component 10, it is ensured that transition points from coated to uncoated are covered by further molded-on components, in order to avoid the potential point of detachment. It is likewise proposed to overmold with a further component the support or anchoring elements necessary in the metallization process, which are necessary for carrying out feeding into the process for providing metallization on the first hard component 10. These points are often metallized inadequately or unattractively.

It is also conceivable to produce the metallic coating 44 by means of CVD, PVD or sputtering. In a known manner, ions are fired with sufficient energy onto a target, from which the desired atoms (or molecules) are knocked out. These atoms (or molecules) fly to the first hard component 10, where they produce the desired metallic coating 44. If appropriate, it is necessary to pretreat the first hard component 10 to improve the bonding of the atoms/molecules. It goes without saying that, by means of this method, as described, the first hard component 10 can also be coated only partially with a metallic coating 44. Since an immersion method is not involved, it is sufficient to design a support or mask or a carrier for the first hard component 10 during the sputtering process, by means of which only the part of the surface of the first hard component 10 that is to be coated is exposed for the process. This metallization process is suitable with preference for 'in-line' production by means of a transporting system.

The metallic coating 44 may also be produced on the first hard component 10 by means of plasma coating. In a known manner, the desired atoms (or molecules) are extracted from a plasma and then deposited on the first hard component 10.

The metallic coating 44 of the first hard component 10 may also be carried out by means of an RIM process (Reaction Injection Molding process). The first hard component 10 is produced in the injection-molding tool, then preferably placed in a further cavity, into which a PU mixture is injected. The PU mixture reacts and cures.

Finally, hot stamping or a decal process would also be conceivable. In this case, the metallic coating 44 or a motif is transferred two-dimensionally or linearly onto the surface of the first hard component 10 by means of a tool, with the aid of a pigmented foil under the influence of pressure, temperature and time. In this case, the hot stamping foil or decal foil required for the purpose may be additionally printed on or decorated in some other way. This technology particularly allows a partial, metallic coating to be produced in a very favorable manner. It is also conceivable to use a number of sequential hot stamping stations for different metallic surface portions of the first hard component 10. A further advantage of hot stamping technology is that this process can take place in a fully automated manner directly on the injection-molding machine. In other words, the first hard components can be removed automatically from the injection-molding tool, stamped and placed again into the injection-molding tool. With reference to FIG. 30, the stamping process A would be integrated directly in the circulating system 92. The handling system would remove the first hard component from the injection-molding tool for stamping and place it onto the circulating system 92 and, once stamping has taken place, return it to the injection-molding tool. It goes without saying that this operation can also be performed with separate injection-molding tools and injection-molding machines. It goes without saying that this method is also suitable for the method described above with a transporting system and a number of independent injection-molding tools, FIG. 32.

To ensure optimum bonding of the layers, it is possible to treat the first hard component 10 in advance before the coating process, for example by degreasing, etching, flame or corona pre-treatment, coating with adhesion promoters or primers. The coating of the metallic surface by means of a protective lacquer may likewise be necessary in the case of some coating processes.

These coating steps may also be integrated 'in-line' into a transporting system.

The surface of the uncoated first hard component 10 has a major influence on the appearance of the coated surface. The roughness decides in a certain way whether the surface is smooth or rough. The fashioning of a surface structure of the first hard component 10 also allows the haptic properties to be changed on the metallic coating. Elements that can be integrated into the surface structure are, for example, nubs, ribs, honeycomb structures, etc. As a result, the surface is structured.

The feel of the surface of the metallically coated first hard component 10 may also be improved by providing surface-area elements of soft material, preferably of polyvinyl chloride (PVC). These surface-area elements (pads) are adhesively attached to the finished surface. The pad has an adhesive or the like provided on one side, ensuring the connection to the coated first hard component 10. The other side of the pad comprises a soft component, which takes the form of a means of improving the bond, for example the form of nubs, ribs, etc.

Instead of or in addition to the metallic coating, it would also be possible to treat the first hard component 10 with active substances which, when the coated first hard component is contacted, are transferred onto the contacting body at the point of contact.

Alternatively or in addition, the first hard component could be printed, lacquered, painted or provided with decoration by other known methods. Further surface treatments/coatingi that can be realized for hard plastics could also be used. As shown in FIG. 32, the lacquering may also be used as an additional or alternative step 'in-line' between the injection-molding processes.

Finally, it is also conceivable to provide a coating that wears away during use. This may, for example, assume a function of indicating when the brush should be replaced or indicating the time for which cleaning has been carried out.

The toothbrush body 12 of a preferred toothbrush according to the invention is only partially provided with the metallic coating 44 on the surface, since, at least in the handle part, the metallic coating is covered in certain regions with a further plastic component. In the case of toothbrushes, the metallic coating 44 preferably lies only in the handle region, i.e. has an exposed surface from the bristle-free end to the start of the neck part. This offers the advantage that rigid regions of the toothbrush which do not deform or deform only a little under the loading that occurs during use are coated in particular. Deforming may be accompanied by breaking of the brittle metallic coating and lead to undesired, partial detachments.

The fastening of the second hard component 48 to the first hard component 10, provided with the metallic coating 44, may take place in a mechanical manner, as explained further above in connection with the exemplary embodiments. The mechanical anchoring preferably takes place by positive and non-positive connection—i.e. clasping of plastic components; preferably by using the shrinkage effect by means of injection molding of the second hard component 48 over the first hard component 10. It goes without saying that other mechanical connecting processes are also conceivable.

The fastening may also be used for the purpose of connecting a number of non-connected elements of coated first hard components 10 to one another. In this case, a number of smaller coated bodies are connected to one another by means of a fastening in order to form part of a toothbrush. The various bodies may be provided with different coatings.

To achieve bonding between the metallic coating 44 and the further plastic component 46, it is possible to add an adhesion promoter to the plastic concerned. This adhesion promoter is preferably already in the granules that are used in the injection-molding device. Wherever possible, commercially available products, used in particular in the production of composite films or composite tubes, are used as the adhesion promoter. These are for example maleic anhydrides (MSA), EBA, SB/PE block copolymer, SB/PP block copolymer, SB blends or an ethylene vinyl acetate (EVA) base, such as EVAC.

It is also conceivable to treat the metallic coating 44 in those regions to which the further plastic component 46 is applied, for example to treat it by means of roughening, etching or the like, to bring about a surface change, to apply lacquer (such as for example Chemlock® from Lord Chemical Products), to apply a primer or some other chemical substance. Also possible are mechanical methods that make it possible to connect the further component 46 to the metallic coating 44.

In terms of weight, the bodies produced in this way are very light, in comparison with actual metal bodies. The metal effect is achieved only with respect to visual appearance. To emphasize the metal effect, it is also possible to introduce weights into plastic bodies in order to achieve the metallic effect also in terms of weight or in order to balance the toothbrush. When additional weights are used, the weight ratio of the handle portion to the head portion is more than 5:1, preferably more than 10:1; in this case, the additional weight weighs more than 8 g, preferably more than 12 g. The separation of the handle portion from the head portion, measured from the handle, takes place after 70% of the overall length of the toothbrush. The additional weight or the additional weights are introduced into a plastic body and fixed to the body by suitable holding means or connecting methods, such as for example depressions, latching lugs, spring-loaded catches, adhesive bonding, in order that the encapsulation can take place. The additional weight is preferably fully encapsulated. However, it is possible partially not to overmold the additional weight and to allow it to come to the surface. These additional weights, may consist of metal or other materials that are provided with higher unit weights in comparison with plastics.

It is also possible to produce the additional weight with a plastic component U or O, in that metal particles are processed during the injection molding of this plastic component (by means of adding them to the masterbatch). Usually, massively higher unit weights are achieved in this way than would be possible in the case of aforementioned plastic components without the addition of metal particles. The unit weight of this plastic component is preferably increased with the metal particles by over 10%, preferably over 30%.

It should be mentioned in connection with the production devices schematically represented in FIGS. 30 and 31 that the working station A, in which the first hard component 10 is provided with the metallic coating 44, can be operated off-line. This means that the working station A may be located at a different location than the other production devices. In particular, it may be spatially removed. The first hard components 10 are transported to the working station A, if appropriate after intermediate storage. There, they are provided with the metallic coating 44 out of the cycle of the multi-component injection-molding machine. The coated first hard components 10 are then transported back to the multi-component injection-molding machine, possibly after intervening intermediate storage. The advantage of off-line operation is that the first hard component 10 has cooled down and shrunk when it is coated. Moreover, the processes in which toxic substances may possibly be used are clearly separated from the other process steps.

In-line operation, in which the first hard components are provided with the metallic coating 44 in the cycle of the multi-component injection-molding machine or individual separate injection-molding machines, would also be conceivable, as already mentioned in connection with CVD, PVD, sputtering or hot stamping technology. In this context, in-line means directly coupled together: in the case of in-line operation, the connection between the injection-molding process and the coating process is preferably ensured by a circulating pallet or logistical system, which connects the processes to one another directly, i.e. without interruption. The various systems or subcomponents of the system are consequently coupled by way of the cycle time; FIG. 32.

The feeding of the coated bodies may take place in various ways. If in-line processing is realized, the bodies or injection moldings are taken over directly by the container, tray, pallet or logistical system and put in place by means of a handling device. In the case of off-line operation, the bodies may be fed and put in place in various ways. The feed is in each case designed in such a way that the coating created is not damaged, i.e. scratched. The transporting of the parts between the processes may handle the bodies as bulk material or the bodies are put down in trays in an orderly fashion. In the case of handling the bodies as bulk material, preparation for placement in the tool may take place for example by means of oscillating conveyors or by means of a cascade feed. The bodies that are individually separated and brought into an aligned state in this way are subsequently placed in the injection-molding tool by an external handling device. This handling device is used in the case of both types of transport and has grippers or a suction device for moving the bodies. Depending on the tool concept, the bodies may be placed in the injection-molding tool in the open or closed state. In the case of conventional tool technology, both removal and loading take place in the open state. The parts introduced by the handling device are held in the injection-molding tool. The holding preferably takes place by means of mechanical grippers, which are integrated directly in the injection-molding tool. However, it is also possible to achieve the holding by means of vacuum suckers, so that the bodies are sucked onto the periphery of the cavity.

More recent tool concepts, in which the first hard component 10 can be removed in the closed state of the tool, are preferably used. The same applies to the placing of the coated first hard component 10. In this way, considerable cycle time can be saved.

The process or the interface between the injection-molding process and the coating process can be optimized in terms of the product. It is possible to form sprue-like regions by means of injection molding, assisting the handling between the processes and in the processes.

The racking described in the previous paragraph, as well as the standard arrangement of the bodies to be coated, has the result that the bodies to be coated must be correspondingly configured, in order that handling in the process is possible at all.

It goes without saying that it is also possible in the same manner, and with a set-up analogous to that of the toothbrushes presented being provided, to produce electric toothbrushes, acoustic toothbrushes, other personal care devices with a treatment head, such as for example wet razors, vibrating wet razors, mascara brushes, hairbrushes and other cosmetic or personal care products. The corresponding production of domestic brushes, such as for example washing brushes, mop sets, shoe brushes, scrubbers, brooms or barbecue brushes, would also be conceivable.

It should additionally be mentioned that it is also possible to provide a soft component of a soft plastic with a metallic coating. For this purpose, the soft component is cleaned on the surface and, if appropriate, pretreated in a flame or plasma process. After that, a primer is applied. After that, atomic chrome or aluminum is vapor-deposited on the dried surfaces by an electrode process in a vacuum installation. These atomic particles form a good connection with the primer. If a high degree of brightness is desired, a protective lacquer may be subsequently applied.

Since the soft component would not withstand subsequent molding on of a hard component, with the associated pressures of the multi-component injection-molding process, or would deform considerably, the soft component, provided at least partially with the metallic coating, is preferably fitted onto the brush body, which is provided with corresponding clearances, passages, undercuts and the like. However, overmolding with a further component is expressly also conceivable if corresponding measures are taken. These include a minimal processing pressure of the further component, overmolding of thin layers of the coated soft component, as well as partial clamping, and consequently exact positioning, of the soft component. The alternative fitting of parts of soft plastic on a toothbrush body is disclosed for example in U.S. Pat. No. 5,339,482. Since, in the fitted state, only part of the soft component 62 forms the surface of the toothbrush, it is conceivable only to provide this part with a metallic coating. It is also conceivable to adhesively bond the soft component, provided with the metallic coating, to the toothbrush body. Connection by welding is also conceivable. Finally, it is also possible to use clasps, springs or similar mechanical aids for fastening the soft component provided with the metallic coating. In a preferred way, the soft component, provided with the metallic coating, is provided with a structured surface, for example recurring surface structures such as nubs, lamellae or the like. This increases the hold and the bond on the otherwise smooth metallic surface.

With the present method, medical products, such as for example pumps and the like, can also be produced. With preference, the bodies produced according to the present method have a hollow space for the medical product, which space is delimited by the plastic component, in particular hard component, provided with a metallic coating.

The invention claimed is:

1. A toothbrush comprising:
a handle part, a cross section of the handle part containing plastic material sections of a first hard component, a second hard component, and a soft component;
a neck part adjoining the handle part; and
a head part carried by the neck part, wherein:
the plastic material section of the first hard component in the handle part is a proportion of at least 10% of the cross section of the handle part, the plastic material section of the first hard component is provided with a metallic coating in at least certain regions of the plastic material section of the first hard component, the metallic coating being at least partially covered by the plastic material section of the second hard component by injection molding;
the plastic material section of the second hard component and the plastic material section of the first hard component are connected to each other in a mechanical manner, without forming a material bond; and
the plastic material section of the soft component is only in contact with the plastic material section of the second hard component.

2. The toothbrush as claimed in claim 1, wherein the plastic material section of the second hard component is mechanically engaged with the plastic material section of the first hard component.

3. The toothbrush as claimed in claim 2, wherein the plastic material section of the second hard component is mechanically engaged by anchoring projections with the plastic material section of the first hard component.

4. The toothbrush as claimed in claim 1, wherein the plastic material section of the soft component is bonded to the plastic material section of the second hard component by a material bond.

5. The toothbrush as claimed in claim 4, wherein the plastic material section of the first hard component, the plastic material section of the second hard component, the plastic material section of the soft component, and the metallic coating are each a portion of an outer surface of the handle part.

6. A toothbrush comprising:
a handle part, a cross section of the handle part containing plastic material sections of a first hard component, a second hard component, and a soft component;
a neck part adjoining the handle part; and
a head part carried by the neck part, wherein:
the plastic material section of the first hard component is provided with a metallic coating in at least certain regions of the plastic material section of the first hard component, a side of the metallic coating is in contact with the first hard component;
an opposing side of the metallic coating is completely surrounded by the plastic material section of the second hard component by injection molding; and
the plastic material section of the soft component contacts the second hard component.

7. The toothbrush as claimed in claim 6, wherein the plastic material section of the first hard component provided with the metallic coating is at least two arms that are portions of the cross section.

8. The toothbrush as claimed in claim 7, wherein the at least two arms are exclusively surrounded by the plastic material section of the second hard component.

9. The toothbrush as claimed in claim 6, wherein the plastic material section of the second hard component and the plastic material section of the soft component are an outer surface of the handle part.

10. A toothbrush comprising:
a handle part, a cross section of the handle part containing plastic material sections of a first hard component, a second hard component, and a soft component;
a neck part adjoining the handle part; and
a head part carried by the neck part, wherein:
the plastic material section of the first hard component is provided with a metallic coating in at least certain regions of the plastic material section of the first hard component; and
the plastic material section of the first hard component, the plastic material section of the second hard component, the plastic material section of the soft component, and the metallic coating are each a portion of an outer surface of the handle part.

11. The toothbrush as claimed in claim 10, wherein the plastic material section of the first hard component provided with the metallic coating is at least two arms that are portions of the cross section.

12. The toothbrush as claimed in claim 11, wherein a cross section of the plastic material section of the second hard component is X-shaped.

13. The toothbrush as claimed in claim 11, wherein the plastic material section of the soft component forms a passage that extends centrally through the plastic material section of the second hard component.

14. The toothbrush as claimed in claim 13, wherein a cross section of the plastic material section of the soft component is H-shaped, and the plastic material section of the soft component is partially around the plastic material section of the second hard component.

15. The toothbrush as claimed in claim 10, wherein the plastic material section of the soft component is not in contact with the plastic material section of the first hard component.

* * * * *